United States Patent
Baek et al.

(10) Patent No.: US 8,698,722 B2
(45) Date of Patent: Apr. 15, 2014

(54) DISPLAY APPARATUS AND DRIVING METHOD THEREOF

(75) Inventors: Seung-Soo Baek, Seoul (KR);
Yong-Soon Lee, Cheonan-si (KR);
Min-Cheol Lee, Seoul (KR);
Seong-Young Lee, Anyang-si (KR)

(73) Assignee: Samsung Display Co., Ltd. (KR)

(*) Notice: Subject to any disclaimer, the term of this patent is extended or adjusted under 35 U.S.C. 154(b) by 958 days.

(21) Appl. No.: 12/145,140

(22) Filed: Jun. 24, 2008

(65) Prior Publication Data

US 2009/0040161 A1 Feb. 12, 2009

(30) Foreign Application Priority Data

Aug. 7, 2007 (KR) .................. 10-2007-0079099

(51) Int. Cl.
*G09G 3/36* (2006.01)
(52) U.S. Cl.
USPC ............................. 345/89; 345/90; 345/100
(58) Field of Classification Search
USPC ............................................ 345/87, 90, 100
See application file for complete search history.

(56) References Cited

U.S. PATENT DOCUMENTS

| | | | |
|---|---|---|---|
| 5,648,793 A | 7/1997 | Chen | |
| 2004/0257322 A1* | 12/2004 | Moon | 345/87 |
| 2006/0176265 A1 | 8/2006 | Kim et al. | |
| 2007/0001953 A1* | 1/2007 | Jang et al. | 345/88 |
| 2007/0091044 A1* | 4/2007 | Park et al. | 345/88 |
| 2008/0048999 A1* | 2/2008 | Chiang et al. | 345/204 |

FOREIGN PATENT DOCUMENTS

| | | |
|---|---|---|
| CN | 1920933 A | 2/2007 |
| EP | 0479552 | 4/1997 |
| EP | 1492078 | 12/2004 |
| GB | 2146478 | 4/1985 |
| JP | 2006-293371 A | 10/2006 |
| JP | 2006-350289 A | 12/2006 |
| KR | 19950003345 B1 | 4/1995 |
| KR | 1020050000105 A | 1/2005 |
| KR | 1020060089829 A | 8/2006 |
| KR | 1020060107669 A | 10/2006 |
| KR | 1020070001485 | 1/2007 |
| KR | 1020070010549 | 1/2007 |
| KR | 1020070028978 | 3/2007 |

OTHER PUBLICATIONS

European Search Report for application No. 08006206.0-2205 dated Jul. 16, 2008.

* cited by examiner

*Primary Examiner* — Jonathan Boyd
(74) *Attorney, Agent, or Firm* — Cantor Colburn LLP

(57) ABSTRACT

A display apparatus includes a panel part having a plurality of gate lines, a plurality of data lines, a plurality of pixels, a data driver and a gate driver part. Each pixel of the plurality of pixels includes a first sub-pixel and a second sub-pixel. The first sub-pixel is connected to a first gate line of the plurality of gate lines and the second sub-pixel is connected to a second gate line of the plurality of gate lines. The first sub-pixel and the second sub-pixel are each commonly connected to one data line of the plurality of data lines. The gate driver part is disposed on the panel part and applies a plurality of gate signals to the plurality of gate lines. A current gate signal of the plurality of gate signals is temporally overlapped with a previous gate signal for a predetermined time interval.

18 Claims, 7 Drawing Sheets

DISPLAY APPARATUS AND DRIVING METHOD THEREOF

This application claims priority to Korean Patent Application No. 2007-79099, filed on Aug. 7, 2007, and all the benefits accruing therefrom under 35 U.S.C. §119, the contents of which in its entirety are herein incorporated by reference.

BACKGROUND OF THE INVENTION

1. Field of the Invention

The present invention relates to a display apparatus and more particularly, to a display apparatus having substantially reduced distortion of images displayed thereon.

2. Description of the Related Art

In general, a liquid crystal display is widely used as an alternative to a cathode ray tube in an image display device. The liquid crystal display includes two substrates spaced apart from each other at a predetermined distance and having liquid crystals disposed therebetween. In the liquid crystal display, an electric field is applied to the liquid crystals to control an intensity of an electric field between the two substrates to adjust an amount of light passing therethrough, thereby displaying a desired image.

A size of the liquid crystal display must be increased to display an increased amount of image information. However, as the size of the liquid crystal display increases, images displayed thereon are distorted at different viewing angles.

BRIEF SUMMARY OF THE INVENTION

The present invention provides a display apparatus having substantially reduced or effectively prevented distortion of images displayed thereon.

A display apparatus according to an exemplary embodiment of the present invention includes a panel part, a data driver, and a gate driver part.

The panel part includes a plurality of gate lines, a plurality of data lines, and a plurality of pixels. Each pixel of the plurality of pixels includes a first sub-pixel and a second sub-pixel. The first sub-pixel is connected to a first gate line of the plurality of gate lines, the second sub-pixel is connected to a second gate line of the plurality of gate lines, and the first sub-pixel and the second sub-pixel are each commonly connected to one data line of the plurality of data lines.

The data driver receives image data and outputs a data signal to the plurality of data lines.

The gate driver part is disposed on the panel part and applies a plurality of gate signals to the plurality of gate lines. A current gate signal of the plurality of gate signals is temporally overlapped with a previous gate signal for a predetermined time interval.

The gate driver part includes a plurality of stages, each of which is connected to a corresponding gate line of the plurality of gate lines. The gate driver further includes a first gate driver which applies a first gate signal to the first sub-pixel and a second gate driver which applies a second gate signal to the second sub-pixel.

The first gate driver and the second gate driver output the first gate signal and the second gate signal, respectively, at a logic high state during a first time interval of a horizontal scanning period to drive the first sub-pixel and the second sub-pixel, respectively, and the second gate driver outputs the second gate signal at the logic high state during a second time interval of the horizontal scanning period to drive the second sub-pixel.

The data driver outputs the data signal having a first voltage level to the first sub-pixel and the second sub-pixel during the first time interval of the horizontal scanning period, and outputs the data signal having a second voltage level lower than the first voltage level to the second sub-pixel during the second time interval of the horizontal scanning period.

A polarity of the data signal is inverted for each consecutive frame and each consecutive row.

The first sub-pixel of a current pixel is precharged with the data signal having the second voltage level while the second sub-pixel of an adjacent previous pixel is charged with the data signal having the second voltage level.

The first sub-pixel is connected to odd-numbered gate lines of the plurality of gate lines and the second sub-pixel is connected to even-numbered gate lines of the plurality of gate lines.

The first gate driver includes odd-numbered stages connected to corresponding odd-numbered gate lines of the plurality of gate lines, and the second gate driver includes even-numbered stages connected to corresponding even-numbered gate lines of the gate lines.

A first stage of the odd-numbered stages receives a scanning start signal and remaining stages of the odd-numbered stages receive a first clock signal and a second clock signal. A first stage of the even-numbered stages receives a scanning start signal and remaining even-numbered stages receive a third clock signal and a fourth clock signal.

A phase difference between the first clock signal and the second clock signal is about 180 degrees and a phase difference between the third clock signal and the fourth clock signal is about 180 degrees.

A phase difference between the first clock signal and the third clock signal is about 90 degrees and a phase difference between the second clock signal and the fourth clock signal is about 90 degrees.

Periods of the first clock signal, the second clock signal, the third clock signal and the fourth clock signal are substantially equal.

The current gate signal and the previous gate signal temporally overlap each other for one fourth of one period of the periods of the first clock signal, the second clock signal, the third clock signal and the fourth clock signal.

An amplitude of the first gate signal output from the first gate driver is different than an amplitude of the second gate signal output from the second gate driver.

Amplitudes of the first clock signal and the second clock signal are different than amplitudes of the third clock signal and the fourth clock signal.

A display apparatus according to an exemplary embodiment of the present invention may further include a timing controller which receives the image data from the outside and outputs the image data to the data driver and a gray-scale voltage generator which provides a gray-scale voltage to the data driver to generate the data signal output to the plurality of data lines.

In an alternative exemplary embodiment of the present invention, a method of driving a display apparatus having a pixel including a first sub-pixel and a second sub-pixel includes: applying a first gate signal at a high logic state and a data signal at a first voltage level to the first sub-pixel during a first time interval of a horizontal scanning period; applying a second gate signal at a high logic state and a data signal at the first voltage level to the second sub-pixel during the first time interval of the horizontal scanning period; and applying the second gate signal at a high logic state and a data signal at a second voltage level to the second sub-pixel during a second time interval of the horizontal scanning period The second voltage level is lower than the first voltage level and at least one of a previous first gate signal and a previous second gate signal temporally overlap at least one of a current first gate signal and a current second gate signal, respectively.

An amplitude of the first gate signal is different than an amplitude of the second gate signal.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
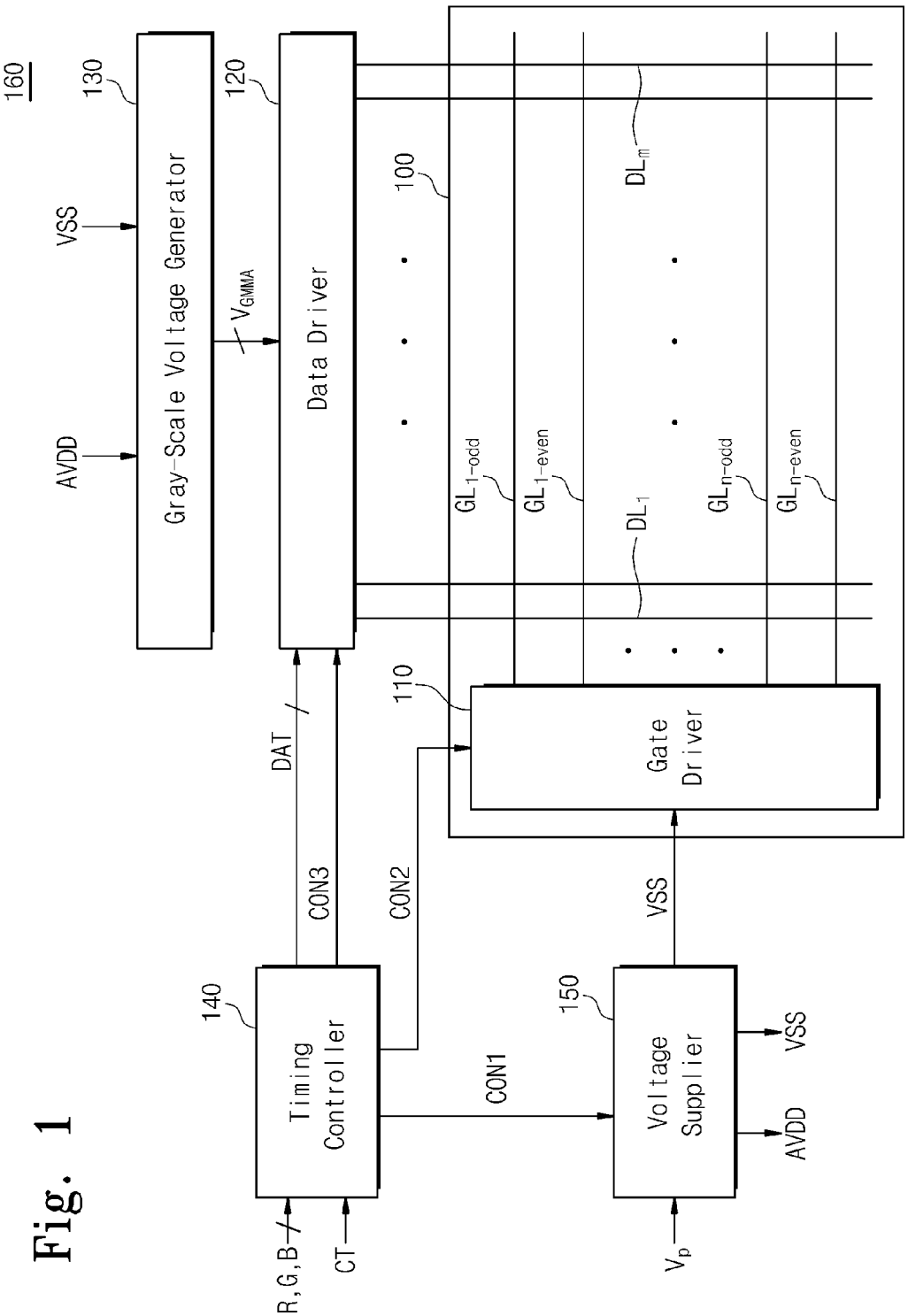
FIG. 1 is a block diagram of a liquid crystal display ("LCD") according to an exemplary embodiment of the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, exemplary embodiments of the present invention will be explained in further detail with reference to the accompanying drawings.

FIG. 1 is a block diagram of a liquid crystal display according to an exemplary embodiment of the present invention.

Referring to FIG. 1, a liquid crystal display ("LCD") 160 includes a display panel 100, a gate driver 110, a data driver 120, a gray-scale voltage generator 130, a timing controller 140 and a voltage supplier 150.

The display panel 100 includes a plurality of gate lines including gate lines $GL_{1\text{-}odd}$, $GL_{1\text{-}even}$, ..., $GL_{n\text{-}odd}$, and $GL_{n\text{-}even}$, a plurality of data lines including data lines $DL_1$-$DL_m$, and a plurality of pixels (not shown). Each pixel of the plurality of pixels includes two sub-pixels each connected to a different gate line and each connected to a same data line, as described in further detail below with respect to FIG. 2.

The timing controller 140 receives image signals R, G and B from a graphics controller (not shown) and outputs a first control signal CON1, a second control signal CON2, a third control signal CON3 and an image signal DAT based on a timing control signal CT. The voltage supplier 150 receives a power voltage $V_p$ from an outside source (not shown) and outputs a first driving voltage AVDD and a second driving voltage VSS based on the first control signal CON1. The first driving voltage AVDD is applied to the gray-scale voltage generator 130, and the second driving voltage VSS is applied to the gray-scale voltage generator 130 and the gate driver 110, as shown in FIG. 1.

The gate driver 110 receives the second driving voltage VSS from the voltage supplier 150 and the second control signal CON2 from the timing controller 140 to sequentially output a plurality of gate signals. In an exemplary embodiment, the gate driver 110 is directly formed on an end portion of the display panel 100 through a thin film process and is electrically connected to the gate lines $GL_{1\text{-}odd}$, $GL_{1\text{-}even}$, ... $GL_{n\text{-}odd}$, and $GL_{n\text{-}even}$ disposed on the display panel 100. Thus, the gate driver 110 sequentially applies the gate signals to the gate lines $GL_{1\text{-}odd}$, $GL_{1\text{-}even}$, ..., $GL_{n\text{-}odd}$, and $GL_{n\text{-}even}$, as described in further detail below.

The gray-scale voltage generator 130 has a resistor-string structure in which individual resistors of a plurality of resistors are connected in a string, e.g., in electrical series with each other. Each individual resistor in the resistor-string structure has the same resistance. The first driving voltage AVDD and the second driving voltage VSS from the voltage supplier 150 are applied to opposite end terminals of the resistor-string structure. In an exemplary embodiment, the second driving voltage VSS is a ground voltage, but alternative exemplary embodiments are not limited thereto. The gray-scale voltage generator 130 outputs gray scale voltages $V_{GMMA}$ of a plurality of gray-scale voltages $V_{GMMA}$ through output terminals, each of which is connected to a corresponding connection node between the individual resistors of the resistor-string structure. The gray-scale voltage generator 130 is not limited to the above-described configuration. Rather, alternative exemplary embodiments of the present invention may include various configurations which output the gray-scale voltages $V_{GMMA}$ of the plurality of gray-scale voltages $V_{GMMA}$.

Still referring to FIG. 1, the data driver 120 receives the image signal DAT and the third control signal CON3 from the timing controller 140 and receives the gray-scale voltages $V_{GMMA}$ from the gray-scale voltage generator 130. Based on the third control signal CON3, the data driver 120 converts the image signal DAT, which is a digital signal, to an analog data voltage based on the gray-scale voltages $V_{GMMA}$. The data driver 120 is electrically connected to the data lines $DL_1$-$DL_m$ disposed on the display panel 100. Accordingly, the analog data voltage output from the data driver 120 is applied to the data lines $DL_1$-$DL_m$.

Figure 2:
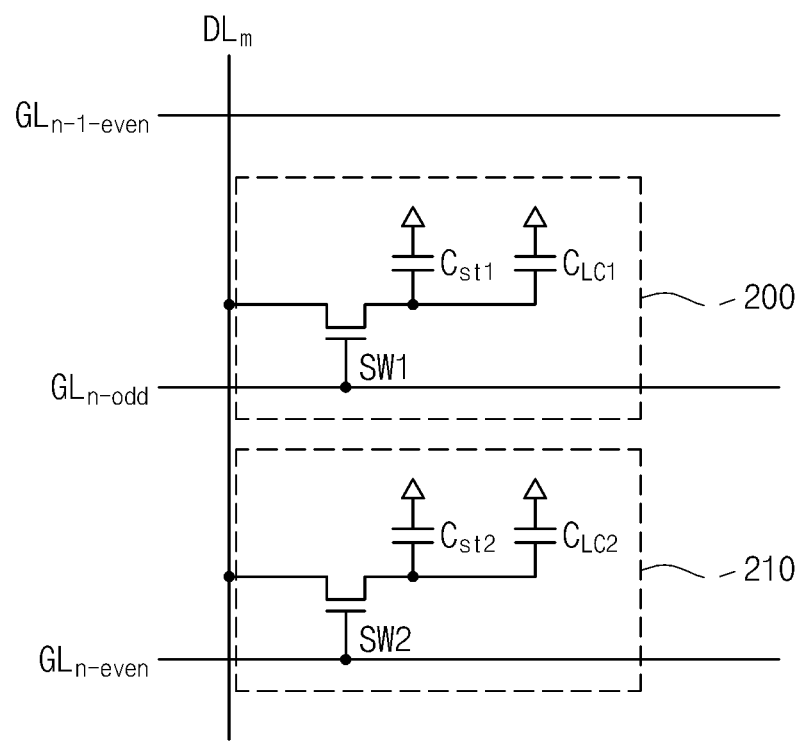
FIG. 2 is an equivalent schematic circuit diagram of a pixel of the LCD according to the exemplary embodiment of the present invention shown in FIG. 1.

FIG. 2 is an equivalent schematic circuit diagram of a pixel of the LCD according to the exemplary embodiment of the present invention shown in FIG. 1.

Referring to FIG. 2, a pixel includes a first sub-pixel 200 and a second sub-pixel 210. The first sub-pixel 200 includes a first switching device SW1, a first storage capacitor $C_{st1}$ and a first liquid crystal capacitor $C_{LC1}$. The first switching device SW1 includes a control terminal connected to an n-th odd-numbered gate line $GL_{n\text{-}odd}$, an input terminal connected to an m-th data line $DL_m$, and an output terminal connected to the first liquid crystal capacitor $C_{LC1}$ and to the first storage capacitor $C_{st1}$. The first storage capacitor $C_{st1}$ maintains an electric charge charged into the first liquid crystal capacitor $C_{LC1}$. More specifically, when a gate signal is applied to the n-th odd-numbered gate line $GL_{n\text{-}odd}$ connected to the control terminal of the first switching device SW1, the first liquid crystal capacitor $C_{LC1}$ is charged with a data voltage applied to the m-th data line $DL_m$ connected to the input terminal of the first switching device SW1. In an exemplary embodiment, the gate signal is defined as a signal which has a voltage level sufficient to turn on the first switching device SW1. The data voltage charged in the first liquid crystal capacitor $C_{LC1}$ is maintained by the first storage capacitor $C_{st1}$ during one frame.

The second sub-pixel 210 includes a second switching device SW2, a second liquid crystal capacitor $C_{LC2}$, and a second storage capacitor $C_{st2}$. Since the second sub-pixel 210 has substantially the same structure and function as the first sub-pixel 200, a repetitive detailed description of the second sub-pixel 210 will be omitted. In an exemplary embodiment, the n-th even-numbered gate line $GL_{n\text{-}even}$ connected to the second switching device SW2 is disposed adjacent to, e.g., subsequent to, the n-th odd-numbered gate line $GL_{n\text{-}odd}$ connected to the first switching device SW1, as shown in FIG. 2.

In an exemplary embodiment of the present invention, the first liquid crystal capacitor $C_{LC1}$ of the first sub-pixel 200 and the second liquid crystal capacitor $C_{LC2}$ of the second sub-pixel 210 are charged with different voltages from each other at different times during one frame, as described in further detail below with reference to FIG. 3. Since the voltage charged in the first sub-pixel 200 is different from the voltage charged in the second sub-pixel 210, distortion of a displayed image at different viewing angles is substantially reduced or effectively prevented in the LCD 160 according to an exemplary embodiment of the present invention.

Figure 3:
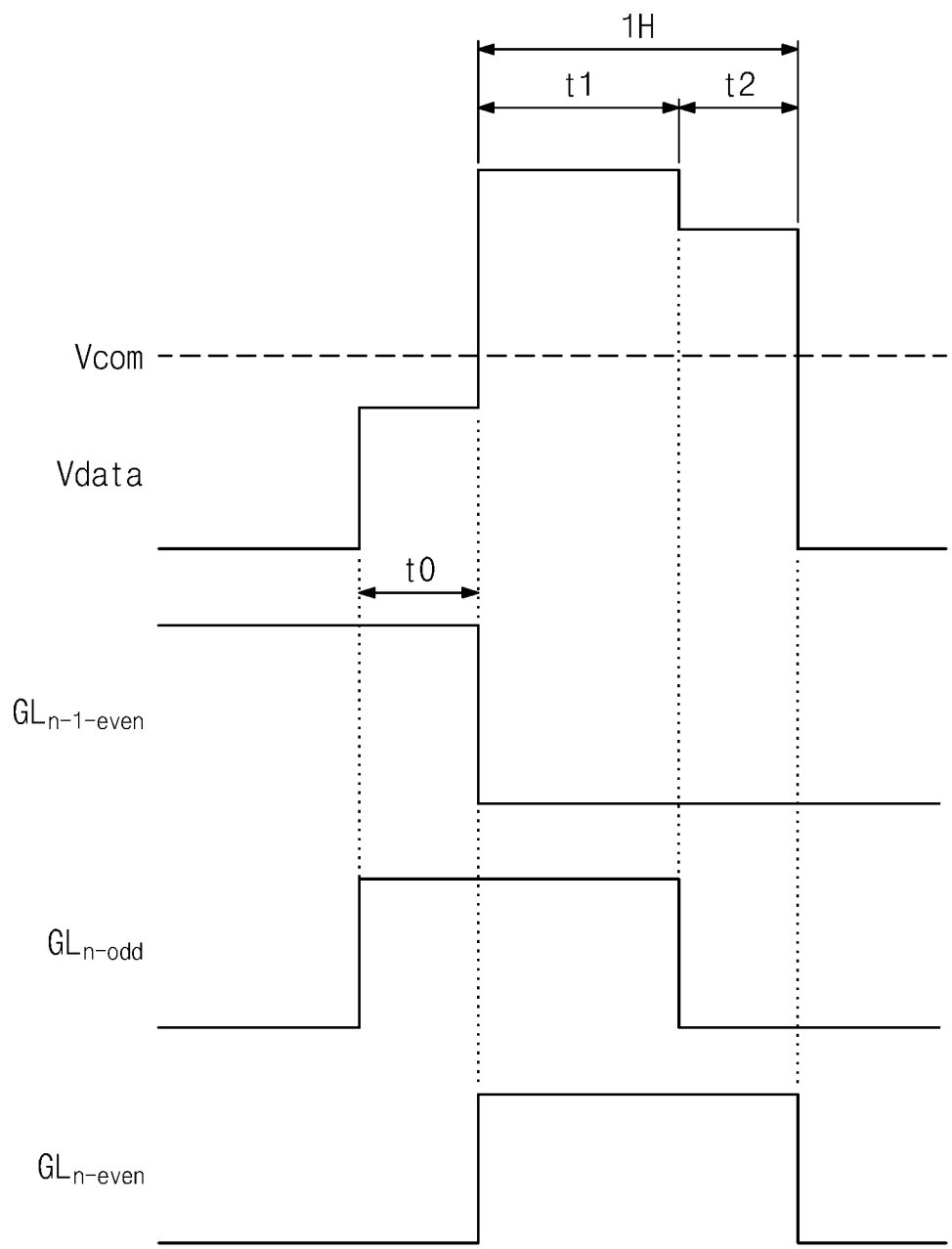
FIG. 3 is a waveform timing diagram of a data signal and a gate signal applied to the pixel of the LCD according to the exemplary embodiment of the present invention shown in FIG. 2.

FIG. 3 is a waveform timing diagram of a data signal and a gate signal applied to the pixel of the LCD according to the exemplary embodiment of the present invention shown in FIG. 2.

As shown in FIG. 3, a gate-on signal, e.g., a gate signal having a high value, is applied to both the n-th odd-numbered gate line $GL_{n\text{-}odd}$ and the n-th even-numbered gate line $GL_{n\text{-}even}$ connected to the first sub-pixel 200 and the second sub-pixel 210, respectively, during a first time interval t1, and a gray-scale data voltage Vdata having a high positive value with respect to a common voltage Vcom is applied to the m-th data line $DL_m$. Therefore, the first sub-pixel 200 and the second sub-pixel 210 are charged with the gray-scale data voltage having the high positive value.

During a second time interval t2, the gate-on signal is not applied to the n-th odd-numbered gate line $GL_{n\text{-}odd}$ connected to the first sub-pixel 200, while the gate-on signal is still applied to the n-th even-numbered gate line $GL_{n\text{-}even}$ connected to the second sub-pixel 210. In addition, a gray-scale data voltage Vdata having a value less than the high positive data value of the gray-scale data voltage Vdata in the first time interval t1 but greater than the common voltage Vcom is applied to the m-th data line $D_m$ connected to the first sub-pixel 200 and the second sub-pixel 210 during the second time interval t2. Thus, the lower gray-scale data voltage Vdata, e.g., the gray-scale data voltage Vdata having a value less than the high positive data value of the gray-scale data voltage Vdata in the first time interval t1 but greater than the common voltage Vcom, is charged only in the second subpixel 210 turned on by the gate signal. As a result, the first sub-pixel 200 maintains the relatively high positive gray-scale data voltage charged therein during the first time interval t1. The first time interval t1 and the second time interval t2 define one horizontal scanning period 1H. As described above in greater detail, in a pixel of the LCD 160 according to an exemplary embodiment, the first sub-pixel 200 is charged with the data voltage Vdata having a high value while the second sub-pixel 210 is charged with the data voltage Vdata having the relatively low value, during a specific time interval, e.g., the second time interval t2, of one horizontal scanning period 1H, as illustrated in FIG. 3.

Still referring to FIG. 3, the gate-on signal is applied to the n-th odd-numbered gate line $GL_{n\text{-}odd}$ and a previous even-numbered gate line $GL_{n\text{-}1\text{-}even}$ during a pre-first time interval t0. Thus, when the gray-scale data voltage Vdata having the relatively low value, e.g., the gray-scale data voltage Vdata having a value less than the high positive data value of the gray-scale data voltage Vdata in the first time interval t1 but greater than the common voltage Vcom, is charged in a second sub-pixel 210 of a pixel scanned at a time adjacent and prior to the pixel which is scanned during the first time interval t1 and the second time interval t2 (hereinafter referred to as a "present pixel"). As a result, the first sub-pixel 200 of the present pixel is also charged with the gray-scale data voltage Vdata having the relatively low value. However, in the LCD 160 according to an exemplary embodiment of the present invention, a polarity of the gray scale data voltage Vdata is inverted every row (referred to as row inversion). Therefore, the gray-scale data voltage Vdata having the relatively low value which is charged in the second sub-pixel 210 of the pixel adjacent and prior to the present pixel has a negative polarity with respect to the common voltage, while the first sub-pixel 200 and the second sub-pixel 210 of the present pixel are each charged by the gray-scale data voltage Vdata having a positive polarity, as shown in FIG. 3.

In an exemplary embodiment of the present invention, the gray-scale data voltage Vdata having the relatively low negative polarity value is precharged in the first sub-pixel 200 of the present pixel, since the gate-on signal is applied to the n-th odd-numbered gate line $GL_{n\text{-}odd}$ during the pre-first time interval t0, prior to and adjacent to the first time interval t1. Further, the gray-scale data voltage Vdata having the relatively low negative polarity value has a voltage level relatively higher, e.g., closer to the common voltage Vcom, than that of the high gray-scale data voltage Vdata having the negative polarity in a time period (not labeled) adjacent and prior to the pre-first tie period T0 in FIG. 3. Thus, when the first sub-pixel 200 of the present pixel is precharged by the gray-scale data voltage Vdata having the relatively low negative polarity value, the first sub-pixel 200 of the present pixel reaches the gray-scale data voltage Vdata having the relatively high positive polarity value in the first time interval t1 faster than in a case when the first sub-pixel 200 of the present pixel is precharged by the gray-scale data voltage Vdata having the relatively high negative polarity.

Thus, as described above, in an LCD 160 according to an exemplary embodiment of the present invention, when gate signals corresponding to adjacent gate lines overlap, the gray-scale data voltage Vdata having the relatively high value and the gray-scale voltage Vdata having the relatively low value are applied to the first sub-pixel 200 and the second sub-pixel 210, respectively, thereby substantially reducing or effectively eliminating distortion of a displayed image at different viewing angles, thereby substantially improving a range of viewing angles of the LCD 160. Further, since the first sub-pixel 200 of the present pixel is precharged, a charging time of the first sub-pixel 200 of the present pixel is reduced, thereby improving a response time of the LCD 160.

Figure 4:
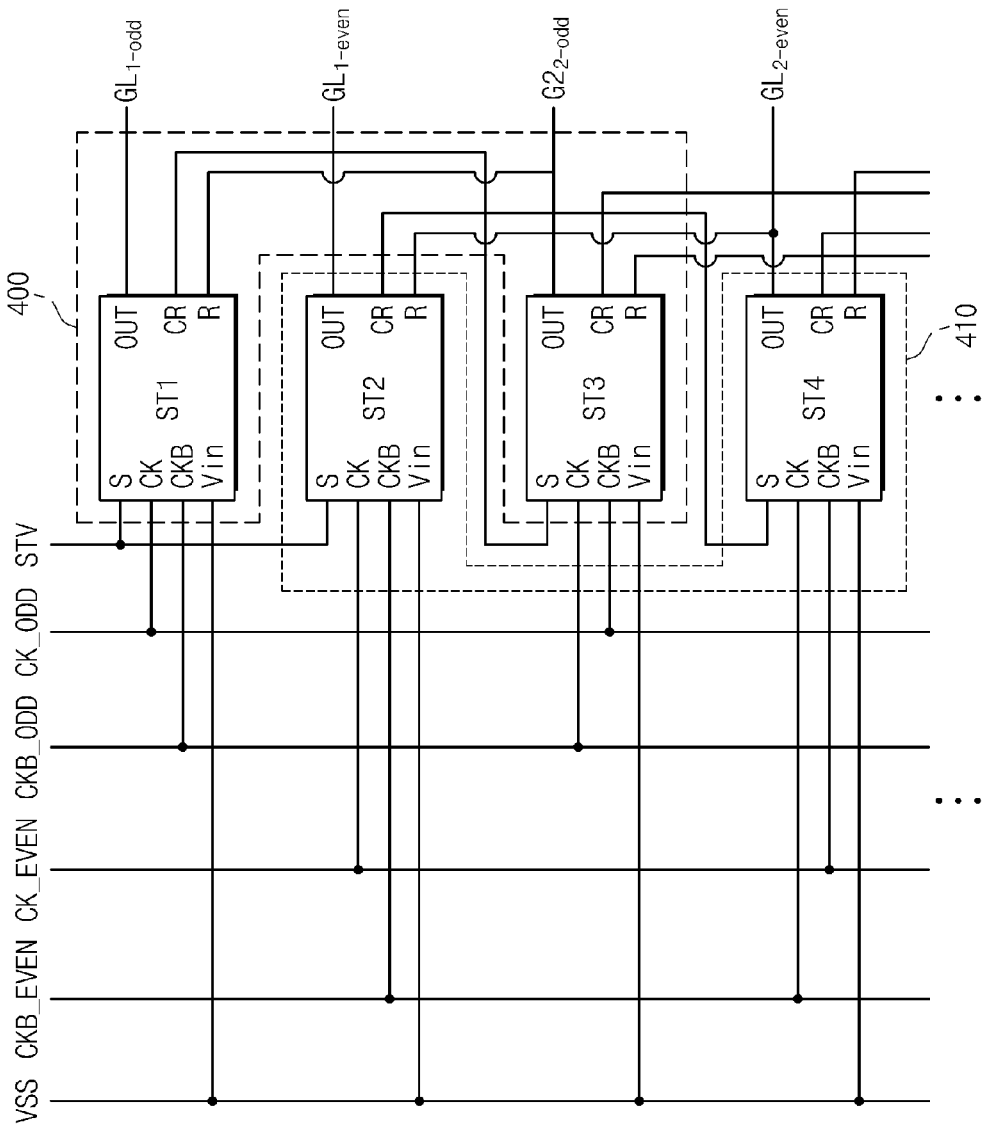
FIG. 4 is a block diagram of a gate driver of the LCD according to the exemplary embodiment of the present invention shown in FIG. 1.

FIG. 4 is a block diagram of a gate driver of the LCD according to the exemplary embodiment of the present invention shown in FIG. 1.

The gate driver 110 (FIG. 1) according to an exemplary embodiment includes a plurality of stages, including a first stage ST1, a second stage ST2, a third stage ST3 and a fourth stage ST4, as shown in FIG. 4. The gate driver 110 is divided into a first gate driver part 400 and a second gate driver part 410. More specifically, the first gate driver part 400 includes odd-numbered first stage ST1 and third stage ST3, while the second gate driver part 410 includes even-numbered second stage ST2 and the fourth stage ST4. Thus, the first gate driver part 400 provides gate signals to the odd-numbered gate lines $GL_{1\text{-}odd}$ and $GL_{2\text{-}odd}$, and the second gate driver 410 provides gate signals to the even-numbered gate lines $GL_{1\text{-}even}$ and $GL_{2\text{-}even}$.

Each of the first stage ST1, the second stage ST2, the third stage ST3 and the fourth stage ST4 includes a set terminal S, a gate voltage terminal Vin, a first clock terminal CK, a second clock terminal CKB, a reset terminal R, a gate output terminal OUT and a carry output terminal CR.

Each of the odd-numbered stages, e.g., the first stage ST1 and the third stage ST3, receives a carry signal output from a carry output terminal CR of an adjacent previous odd-numbered stage through the set terminal S thereof and receives a gate signal output from the gate output terminal OUT of an adjacent subsequent odd-numbered stage through the reset terminal R thereof. However, the first stage ST1 of the first gate driver part 400 receives a scanning start signal STV through the set terminal S thereof in lieu of a carry signal from a previous odd-numbered stage. Also, each odd-numbered stage, e.g., the first stage ST1 and the third stage ST3 receives a first clock signal CK_ODD and a second clock signal CKB_ODD alternatively applied to the first clock terminal CK and the second clock terminal CKB, respectively, and receives a gate-off voltage VSS through the gate voltage terminal Vin thereof. More specifically, when the first clock signal CK_ODD is applied to the first clock terminal CK, the second clock signal CKB_ODD is applied to the second clock terminal CKB of a given odd-numbered stage. Further, the first clock signal CK_ODD and the second clock signal CKB_ODD are alternately applied to the first clock terminal CK and the second clock terminal CKB of each consecutive odd-numbered stage, as shown in FIG. 4.

Similarly, each even-numbered stage, e.g., the second stage ST2 and the fourth stage ST4 of FIG. 4, receives a carry signal output from a carry output terminal CR of an adjacent previous even-numbered stage through the set terminal S thereof and receives a gate signal output from the gate output terminal OUT of an adjacent subsequent even-numbered stage through the reset terminal R thereof. The second stage ST2 of the second gate driver part 400, however, receives the scanning start signal STV through the set terminal S thereof in lieu of a carry signal from a previous even-numbered stage. Also, each even-numbered stage, e.g., the second stage ST2 and the fourth stage ST4 receives a third clock signal CK_EVEN and a fourth clock signal CKB_EVEN alternatively applied to the first clock terminal CK and the second clock terminal CKB, respectively, and receives the gate-off voltage VSS through the gate voltage terminal Vin thereof. Specifically, when the third clock signal CK_EVEN is applied to the first clock terminal CK, the fourth clock signal CKB_EVEN is applied to the second clock terminal CKB of a given even-numbered stage. Thus the third clock signal CK_EVEN and the fourth clock signal CKB_EVEN are alternately applied to the first clock terminal CK and the second clock terminal CKB, respectively, of each even-numbered stage.

The first to fourth clock signals CK_ODD, CKB_ODD, CK_EVEN and CKB_EVEN, respectively, have a high voltage level substantially equal to a voltage level which turns on a switching device of the pixel of the LCD 160, as well as a low voltage level substantially equal to a voltage level which turns off the switching device thereof. The scanning start signal STV, and the first to fourth clock signals CK_ODD, CKB_ODD, CK_EVEN, and CKB_EVEN, respectively, are included in the second control signal CN2 output from the timing controller 140 to the gate driver 110 (FIG. 1), but alternative exemplary embodiments are not limited thereto.

Figure 5:
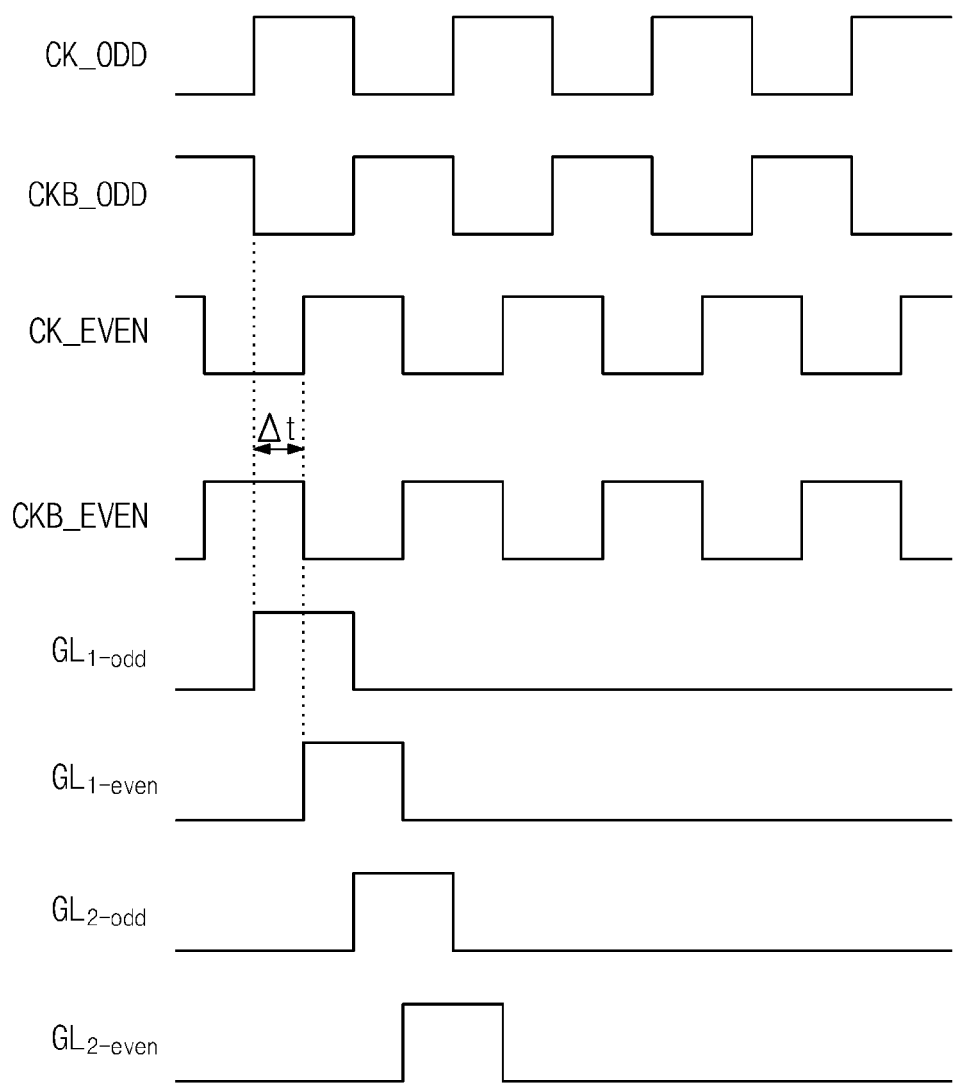
FIG. 5 is a waveform timing diagram of first to fourth clock signals and first to fourth gate signals of the gate driver according to the exemplary embodiment of the present invention shown in FIG. 4.

FIG. 5 is a waveform timing diagram of first to fourth clock signals and first to fourth gate signals of the gate driver according to the exemplary embodiment of the present invention shown in FIG. 4.

Referring to FIG. 5, the first to fourth clock signals CK_ODD, CKB_ODD, CK_EVEN, and CKB_EVEN, respectively, have a substantially equal period. A phase difference between the first clock signal CK_ODD and the second clock signal CKB_ODD is substantially 180 degrees, e.g., one half of one period, and a phase difference between the third clock signal CK_EVEN and the fourth clock signal CKB_EVEN is substantially 180 degrees. Further, a phase difference Δt between the first clock signal CK_ODD and the third clock signal CK_EVEN is substantially 90 degrees, e.g., substantially one half of one period, and a phase difference Δt between the second clock signal CKB_ODD and the fourth clock signal CKB_EVEN is substantially 90 degrees. Each of the first to fourth clock signals CK_ODD, CKB_ODD, CK_EVEN, and CKB_EVEN, respectively, maintains a high level during a half of one period and maintains a low level during a remaining half of the one period.

The first gate driver part 400 provides gate signals corresponding to high periods of the first clock signal CK_ODD and the second clock signal CKB_ODD to the first odd-numbered gate line $GL_{1\text{-}odd}$ and the first even-numbered gate line $GL_{2\text{-}odd}$, respectively. The second gate driver part 410 provides gate signals corresponding to high periods of the third clock signal CK_EVEN and the fourth clock signal CKB_EVEN to the first even-numbered gate line $G_{1\text{-}even}$ and the first even-numbered gate line $GL_{2\text{-}even}$, respectively, as shown in FIG. 5. Since there is the phase difference of substantially 90 degrees between the first clock signal CK_ODD and the third clock signal CK_EVEN, the gate signal applied to the first odd-numbered gate line $GL_{1\text{-}odd}$ overlaps the gate signal applied to the first even-numbered gate line $GL_{1\text{-}even}$ during a specific time interval, e.g., one quarter of one period, as shown in FIG. 5. Further, since there is the phase difference of substantially 90 degrees between the second clock signal CBK_ODD and the fourth clock signal CKB_EVEN, the gate signal applied to the second odd-numbered gate line $GL_{2\text{-}odd}$ overlaps the gate signal applied to the second even-numbered gate line $GL_{2\text{-}even}$ during the specific time interval, e.g., one quarter of one period.

As described in further detail above, in an inversion driving method a polarity of a data voltage applied to a given pixel is inverted every frame and is opposite to a polarity of a data voltage applied to an adjacent pixel to prevent deterioration of the liquid crystal. Further, a given gate signal overlaps with a gate signal applied to an adjacent gate line, thereby achieving a precharge effect. More specifically, the precharge effect is achieved during an overlapping time interval wherein an odd-numbered gate signal overlaps a previous even-numbered gate signal, and a charge in the corresponding pixel is maintained until the respective gate signal is turned off after the associated precharge effect is achieved.

As also described above in greater detail, the pixel of the LCD 160 according to an exemplary embodiment includes the first sub-pixel 200 and the second sub-pixel 210, wherein the first sub-pixel 200 is connected to an odd-numbered gate line and the second sub-pixel 210 is connected to an even-numbered gate line, as shown in FIG. 2. Thus, when the gray-scale data voltage Vdata (FIG. 3) having the relatively high positive polarity value is applied to the first sub-pixel 200 and the gray-scale data voltage Vdata having the relatively low positive polarity value is applied to the second sub-pixel 210, the first sub-pixel 200 of an adjacent subsequent pixel is precharged with the gray-scale data voltage Vdata having the relatively low negative polarity value when the gray-scale data voltage Vdata having the relatively low negative polarity value is applied to the second sub-pixel 210 of an adjacent previous pixel. Since the adjacent subsequent pixel is charged with the gray-scale data voltage Vdata having the relatively high negative polarity value during the previous frame, the precharge is achieved when the next pixel is charged with the gray-scale data voltage Vdata having the relatively low negative polarity value. Then, when the first sub-pixel 200 is charged with the gray-scale data voltage Vdata having the relatively high positive polarity value, the second sub-pixel 210 charged with the gray-scale data voltage Vdata having the relatively low negative polarity value in the previous frame is precharged with the gray-scale data voltage Vdata having the relatively high positive polarity value.

Referring again to FIG. 5, in an exemplary embodiment, the first clock signal CK_ODD and the third clock signal CK_EVEN have a phase difference of substantially 90 degrees therebetween and the second clock signal CKB_ODD and the fourth clock signal CKB_EVEN also have a phase difference of substantially 90 degrees therebetween, but alternative exemplary embodiments are not limited thereto. For example, the phase difference between the first clock signal CK_ODD and the third clock signal CK_EVEN and/or the phase difference between the second clock signal CKB_ODD and the fourth clock signal CKB_EVEN may be set to different and various values based on a desired precharging time. Further, nil alternative exemplary embodiments, a gate signal output from the first gate driver part 400 may have a voltage amplitude different from a voltage amplitude of a gate signal output from the second driver part 410 in order to prevent a kickback voltage, e.g., a shift in pixel voltage, which may be generated between the first sub-pixel 200 charged with the high gray-scale data voltage and the second sub-pixel 210 charged with the low gray-scale data voltage, as will now be described in further detail with reference to FIG. 6.

Figure 6:
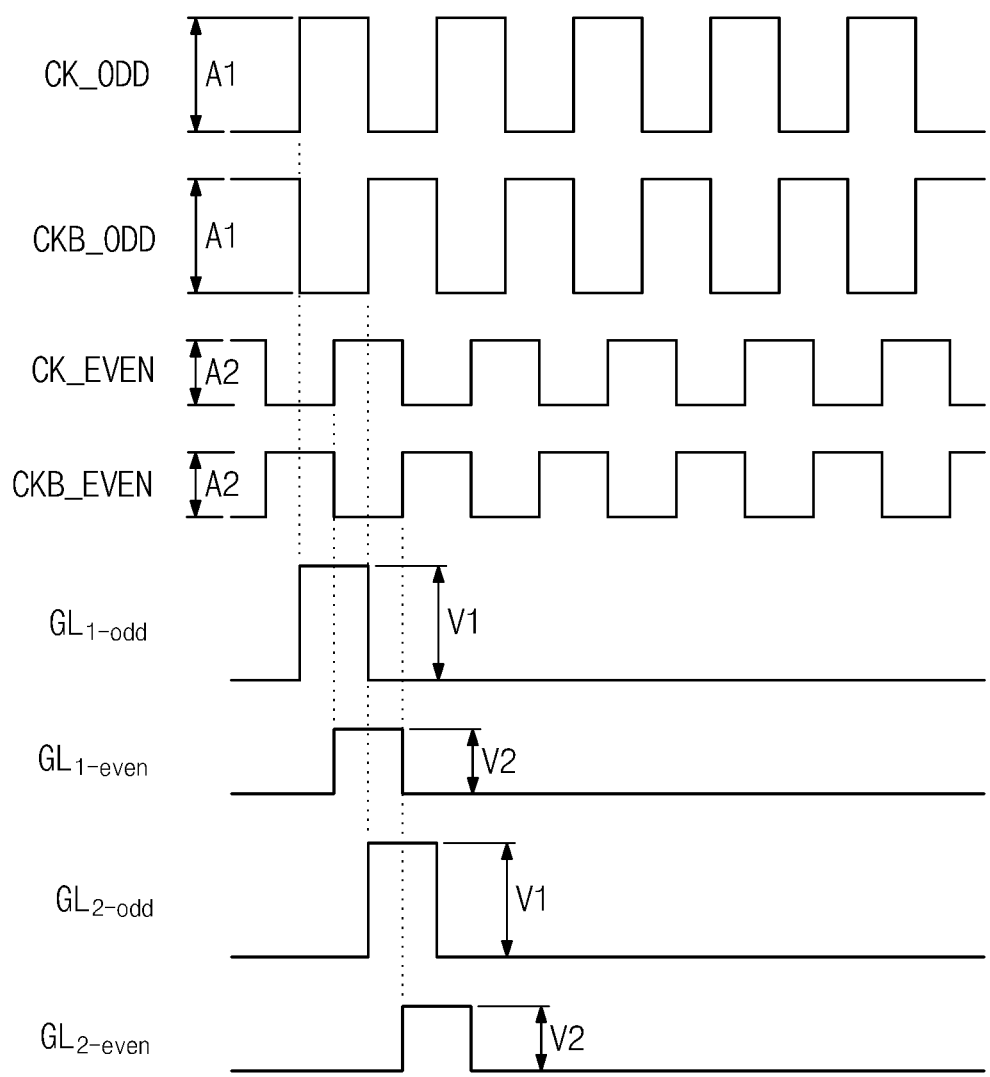
FIG. 6 is a waveform timing diagram of first to fourth clock signals and first to fourth gate signals of a gate driver of an LCD according to an alternative exemplary embodiment of the present invention.

FIG. 6 is a waveform timing diagram of first to fourth clock signals and first to fourth gate signals of a gate driver of an LCD according to an alternative exemplary embodiment of the present invention.

Referring to FIG. 6, the first clock signal CK_ODD and the second clock signal CKB_ODD have a first clock amplitude A1, while the third clock signal CK_EVEN and the fourth clock signal CKB_EVEN have a second clock amplitude A2 smaller than the first clock amplitude A1. Further, a phase difference between the first clock signal CK_ODD and the second clock signal CKB_ODD is substantially 180 degrees, while a phase difference between the third clock signal CK_EVEN and the fourth clock signal CKB_EVEN is substantially 180 degrees, as shown in FIG. 6. Also, the first clock signal CK_ODD and the third clock signal CK_EVEN have a phase difference of substantially 90 degrees therebetween, and the second clock signal CKB_ODD and the fourth clock signal CKB_EVEN also have a phase difference of substantially 90 degrees therebetween. As a result, a gate signal output from the first gate driver part 400 and applied to odd-numbered gate lines $GL_{1-odd}$ and $GL_{2-odd}$ has a first gate voltage amplitude V1 based on the first clock signal CK_ODD and the second clock signal CKB_ODD, while a gate signal output from the second gate driver part 410 and applied to even-numbered gate lines $GL_{1-even}$ and $GL_{2-even}$ has a second gate voltage amplitude V2 different than the first gate voltage amplitude V1. Specifically, in a case in which the first clock amplitude A1 of the first clock signal CK_ODD and the second clock signal CKB_ODD is greater than the second clock amplitude A2 of the third clock signal CK_EVEN and the fourth clock signal CKB_EVEN, the first gate voltage amplitude V1 of the gate signal output from the first gate driver part 400 is greater than the second gate voltage amplitude V2 of the gate signal output from the second gate driver part 410, as shown in FIG. 6.

Relationships and values of the amplitudes of the first to fourth clock signals CK_ODD, CKB_ODD, CK_EVEN, and CKB_EVEN, respectively, in alternative exemplary embodiments of the present invention are not limited to those shown in FIG. 6. Rather, the amplitudes of the first to fourth clock signals CK_ODD, CKB_ODD, CK_EVEN, and CKB_EVEN, respectively, may be set to different and various values. As a result, a voltage amplitude of a sub-pixel, e.g., the first sub-pixel 200 and/or the second sub-pixel 210, is sufficiently charged during operation of the LCD 160 according to an exemplary embodiment of the present invention. More specifically, a voltage amplitude of the gate signal applied to a sub-pixel which may be charged insufficiently, e.g., the first sub-pixel 200, is set to relatively high value with respect to a voltage amplitude of the gate signal applied to the other sub-pixel, e.g., the second sub-pixel 210, thereby reducing kickback voltage difference between the first sub-pixel 200 and the second sub-pixel 210.

Figure 7:
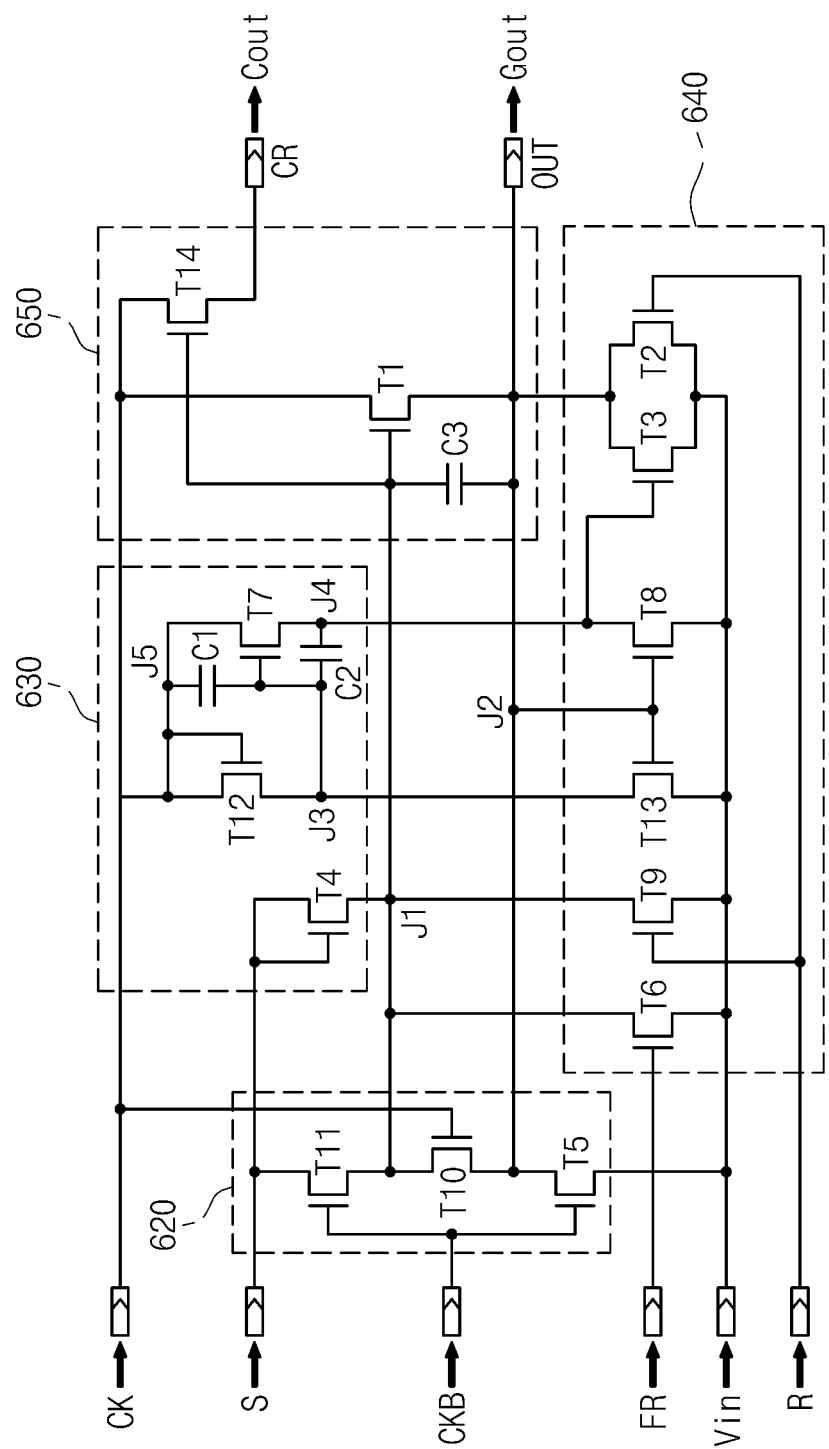
FIG. 7 is a schematic circuit diagram of a single stage of the gate driver according to the exemplary embodiment of the present invention shown in FIG. 4.

FIG. 7 is a schematic circuit diagram of a single stage of the gate driver according to the exemplary embodiment of the present invention shown in FIG. 4. The stages of the gate driver 110 (FIG. 1), e.g., the first stage ST1, the second stage ST2, the third stage ST3 and the fourth stage ST4 (FIG. 4), each have substantially the same configuration and function, as described in greater detail above. Therefore only one stage is illustrated in further detail in FIG. 7, and only one stage will now be described in further detail, in order to avoid redundancy.

Referring to FIG. 7, a single stage includes an input part 620, a pull-up driving part 630, a pull-down driving part 640 and an output part 650. The single stage further includes first to fourteenth transistors T1 to T14, respectively, first to third capacitors C1 to C3, respectively, and first to fourth nodes J1 to J4, respectively.

More specifically, the input part 620 includes the fifth, tenth and eleventh transistors T5, T10 and T11, respectively, connected in series with each other between a set terminal S of the single stage and a gate voltage terminal Vin of the single stage. Gates of the fifth and eleventh transistors T5 and T11, respectively, are connected to a second clock terminal CKB of the single stage, and a gate of the tenth transistor T10 is connected to a first clock terminal CK of the single stage. A contact point between the eleventh transistor T11 and the tenth transistor T10 is connected to the first node J1, and a contact point between the tenth transistor T10 and the fifth transistor T5 is connected to the second node J2, as shown in FIG. 7.

The pull-up driving part 630 includes the fourth transistor T4 connected between the set terminal S of the single stage and the first node J1, the twelfth transistor T12 connected between the first clock terminal CK and the third node J3, and the seventh transistor T7 connected between the first clock terminal CK and the fourth node J4. The fourth transistor T4 includes a gate and a drain commonly connected to the set terminal S, and a source connected to the first node J1. The twelfth transistor T12 includes a gate and a drain commonly connected to the first clock terminal CK, e.g., the fifth node J5, and a source connected to the third node J3. The seventh transistor T7 includes a gate connected to the third node J3 and connected to the first clock terminal CK, e.g., the fifth node J5, through the first capacitor C1, a drain connected to the first clock terminal CK, and a source connected to the fourth node J4. The pull-up driving part 630 further includes the second capacitor C2 connected between the third node J3 and the fourth node J4.

The pull-down driving part 640 includes the sixth, ninth, thirteenth, eighth, third and second transistors T6, T9, T13, T8, T3 and T2, respectively, each receiving the gate-off voltage VSS to a source thereof through the gate voltage terminal Vin of the single stage. The sixth transistor T6 and the ninth transistor T9 output the gate-off voltage Vss through a drain thereof to the first node J1, the thirteenth transistor T13 outputs the gate-off voltage Vss through a drain thereof to the third node J3, the eighth transistor T8 outputs the gate-off voltage Vss through a drain thereof to the fourth node J4, and the third transistor T3 and the second transistor T2 output the gate-off voltage Vss through a drain thereof to the second node J2. Further, the sixth transistor T6 includes a gate connected to a frame reset terminal FR of the single stage and a drain connected to the first node J1, and the ninth transistor T9 includes a gate connected to a reset terminal R of the single stage and a drain connected to the first node J1. Gates of the thirteenth and eighth transistors T13 and T8, respectively, are commonly connected to the second node J2, and drains of the thirteenth and eighth transistors T13 and T8, respectively, are connected to the third node J3 and the fourth node J4, respectively. The third transistor T3 includes a gate connected to the fourth node J4 and a drain connected to the second node J2. The second transistor T2 includes a gate connected to the reset terminal R of the single stage and a drain connected to the second node J2.

The output part 650 includes the first and fourteenth transistors T1 and T14, respectively. The first transistor T1 includes a gate connected to the first node J1, a drain connected to the first clock terminal CK of the single stage, and a source connected to an output terminal OUT of the single stage, through which a gate signal Gout is output, and to the second node J2. The fourteenth transistor T14 includes a gate connected to the first node J1, a drain connected to the first clock terminal CK of the single stage, and a source connected to a carry terminal CR of the single stage, through which a carry signal Cout is output. The output part 650 further includes the third capacitor C3 connected between the first node J1 and the second node J2.

In an exemplary embodiment, each of the first to fourteenth transistors T1 to T14, respectively, is an NMOS transistor, as shown in FIG. 7, but alternative exemplary embodiments are not limited thereto. For example, any or all of the first to fourteenth transistors T1 to T14, respectively, may be a PMOS transistor. Further, the first, second and third capacitors C1, C2 and C3, respectively, may be implemented as a parasitic capacitance formed between a gate, drain, and/or source of one or more of the first to fourteenth transistors T1 to T14, respectively, but alternative exemplary embodiments are not limited to the foregoing description.

An operation of the single stage will now be described in further detail with respect to FIG. 7. For purposes of the description, a voltage corresponding to a high level of a clock signal applied to the first clock terminal CK of the single stage, e.g., the first clock signal CK_ODD (FIG. 4), has a level substantially the same as a level of voltage which turns on switching devices of the LCD 160, and will hereinafter be referred to as a high voltage. Further, a voltage corresponding to a low level of a clock signal applied to the second clock terminal CKB of the single stage, e.g., the second clock signal CKB_ODD (FIG. 4), has a level substantially equal to a level of the gate-off voltage VSS, and will hereinafter be referred to as a low voltage.

When a previous carry signal Cout is applied to the set terminal S of a current single stage and the clock signal applied to the second clock terminal CKB of the current single stage are in a logic high state, the eleventh, fifth, and fourth transistors T11, T5 and T4, respectively, are turned on. As a result, the eleventh and fourth transistors T11 and T4, respectively, provide the high voltage to the first node J1, while the fifth transistor T5 provides the low voltage to the second node J2. Therefore, the first and fourteenth transistors T1 and T14, respectively, are turned on, and the clock signal applied to the first clock terminal CK is thereby outputted through the carry terminal CR and the output terminal OUT of the current single stage. Since a voltage at the second node J2 and the clock signal are the low voltage level, the gates signal Gout and the carry signal Cout output through the output terminal OUT and the carry terminal CR, respectively, are at the low voltage level. Further, the third capacitor C3 is charged to a voltage substantially corresponding to a difference between the high voltage and the low voltage.

At this time, since the clock signal applied to the first clock signal CK of the current single stage and the gate signal Gout of the subsequent adjacent single stage are at a logic low state, the second node J2 remains at the logic low state, and the tenth, ninth, twelfth, thirteenth, eighth, and second transistors T10, T9, T12, T13, T8, and T2, respectively, are turned off.

When the clock signal applied to the second clock terminal CKB of the current single stage transitions to a logic low state, the eleventh and fifth transistors T11 and T5, respectively, are turned off. At substantially the same time, the clock signal applied to the first clock terminal CK of the current single stage transitions to a logic high state, and an output voltage of the first transistor T1 and a voltage of the second node J2 therefore transition to the high voltage. Although the high voltage is applied to the gate of the tenth transistor T10, the electric potential difference between the gate and source of the tenth transistor T10 is substantially zero because the source of the tenth transistor T10 connected to the second node J2 is at the high voltage. As a result, the tenth transistor T10 remains in a turned-off state. Accordingly, the first node J1 is in a floating state and an electric potential of the first node J1 increases to substantially the high voltage charged to the third capacitor C3.

The clock signal applied to the first clock terminal CK of the current single stage and the second node J2 have the high voltage, and the twelfth, thirteenth and eighth transistors T12, T13, and T8, respectively, are thereby turned on. Further, since the twelfth transistor T12 and the thirteenth transistor T13 are connected in series with each other between the high voltage and the low voltage, e.g., between the first clock terminal CK and the gate voltage terminal Vin of the current single stage, the third node J3 is at an electric potential substantially corresponding to a voltage value substantially equal to a value determined by turn-on resistance values of the twelfth and thirteenth transistors T12 and T13, respectively, e.g., a value voltage-divided between the twelfth and thirteenth transistors T12 and T13, respectively. In an exemplary embodiment, a turn-on resistance value of the thirteenth transistor T13 is about ten thousand times greater than a turn-on resistance value of the twelfth transistor T12, and the voltage value of third node J3 is therefore substantially equal to the high voltage. Thus, the seventh transistor T7 is turned on. Since the seventh transistor T7 is connected in electrical series with the eighth transistor T8 through the fourth node J4, the fourth node J4 has an electric potential substantially corresponding to a voltage value voltage-divided by turn-on resistance values of the seventh and eighth transistors T7 and T8, respectively. In an exemplary embodiment, the turn-on resistance values of the seventh and eight transistors T7 and T8 are substantially the same value, and the fourth node J4 therefore has an electric potential corresponding to an intermediate voltage value substantially between the high voltage and the low voltage. As a result, the third transistor T3 is maintained in a turned off state. Thus, the gate signal Gout of a subsequent single stage, applied through the reset terminal R of the current single stage, is at a logic low level, and the ninth and second transistors T9 and T2, respectively, are maintained in a turned off state. Accordingly, the gate signal Gout and the carry signal Cout having the high voltage are output through the output terminal OUT and the carry terminal CR, respectively, of the current single stage.

The first capacitor C1 is charged to a voltage substantially corresponding to an electric potential difference between the third node J3 and the fifth node J5, while the second capacitor C2 is charged to a voltage substantially corresponding to an electric potential difference between the fourth node J4 and the fifth node J5. Further, a voltage at the third node J3 is lower than a voltage at the fifth node J5, since the clock signal applied to the first clock terminal CK, e.g., to the fifth node J5, of the current single stage is at a logic high level.

When the gate signal Gout of the subsequent single stage and the clock signal applied to the second clock terminal CKB of the current single stage transition to a logic high level and the clock signal applied to the first clock terminal CK of the current single stage transitions to a logic low level, the ninth and second transistors T9 and T2, respectively, are turned on, thereby applying the low voltage to the first and second nodes J1 and J2, respectively. Thus, a voltage at the first node J1 drops to the low voltage level while the third capacitor C3 discharges. A predetermined time elapses before the voltage at the first node J1 transitions to the low voltage level, due to a discharging time of the third capacitor C3. Thus, the first and fourteenth transistors T1 and T14, respectively, are maintained in a turned on state during a portion of the predetermined time after to the gate signal Gout of the subsequent single stage transitions to a logic high level, e.g., the gate signal Gout and the carry signal Cout of the current single stage do not transition to the low voltage level until the predetermined time elapses. Further, when the first node J1 transitions to the low voltage level, e.g., when the third capacitor C3 substantially completely discharges, the fourteenth transistor T14 is turned off and the carry terminal CR is electrically disconnected from the first clock terminal CK of the current single stage, and the carry signal Cout is thereby floated, e.g., is maintained at substantially the low voltage level. In addition, although the first transistor T1 is turned off, the output terminal OUT of the current single stage receives the low voltage through the second transistor T2, and the low voltage is thereby continuously output from the output terminal OUT of the current single stage.

When the twelfth and thirteenth transistors T12 and T13, respectively, are turned off, the third node J3 is in a floating state. A voltage at the fifth node J5 is thereby lowered below a voltage at the fourth node J4 while a voltage at the third node J3 is lowered below a voltage at the fifth node J5, thereby turning off the seventh transistor T7. Substantially simultaneously, the third transistor T3 is turned off and a voltage at the fourth node J4 is lowered, and the third transistor T3 is therefore maintained in a turned off state. Further, the clock signal applied to the first clock terminal CK of the current single stage is at the low voltage and is applied to the gate of the tenth transistor T10. A voltage at the second node J2 therefore transitions to a logic low level, to thereby maintain the tenth transistor T10 in a turned off state.

When the clock signal applied to the first clock terminal CK of the current single stage again transitions to a logic high level, the twelfth and seventh transistors T12 and T7, respectively, are turned on and a voltage at the fourth node J4 increases to turn on the third transistor T3, applying the low voltage to the second node J2 and the output terminal OUT of the current single stage to maintain the gate signal Gout of the current single stage at the low voltage level. Thus, although the gate signal Gout of the subsequent single stage is at a logic low state, a voltage of the second node J2 is maintained at the low voltage level.

When the clock signal having the high voltage level applied to the first clock terminal of the current single stage is applied to the gate of the tenth transistor T10, the tenth transistor T10 is turned on and the voltage level at the second node J2, e.g., the low voltage, is thereby applied to the first node J1. Thus, the first clock terminal CK is connected to the drains of the thirteenth and fourteenth transistors T13 and T14, respectively. In an exemplary embodiment, the thirteenth transistor T13 has a large size compared with the other transistors, and a parasitic capacitance between the gate and the drain of the thirteenth transistor T13 is thereby relatively large, and a voltage variation of the drain influences a gate voltage thereof. As a result, when the clock signal applied to the first clock terminal CK of the current single stage transitions to the logic high level, the thirteenth transistor T13 is turned on by the gate voltage increased by the parasitic capacitance between the gate and the drain thereof. Thus, when the low voltage at the second node J2 is transmitted to the first node J1, the gate voltage of the thirteenth transistor T13 is maintained at the low voltage level, thereby preventing the thirteenth transistor T13 from turning on.

Therefore, a voltage at the first node J1 is maintained at the low voltage level until the carry signal Cout from the previous single stage transitions to a logic high level, and the voltage of the second node J2 is maintained at the low voltage level, through the third transistor T3, when the clock signal applied to the first clock terminal CK of the current single stage is at a logic high state and the clock signal applied to the second clock terminal CKB of the current single stage is at a logic low state. Further, the voltage at the second node J2 is maintained at the low voltage through the fifth transistor T5 when the clock signal applied to the first clock terminal CK of the current single stage transitions back to a logic low level and the clock signal applied to he second stage CKB of the current single stage transitions back to a logic high level.

The sixth transistor T6 applies the gate-off voltage VSS to the first node J1 in response to an initializing signal applied through the frame reset terminal FR of the current single stage, and a voltage at the first node J1 is thereby set to the low voltage level again. In an exemplary embodiment, the initializing signal is the carry signal Cout generated from a last single stage among the single stages of the gate driver 110, e.g., the single stage associated with a last odd-numbered gate line $GL_{n\text{-}odd}$ or a last even-numbered gate line $GL_{n\text{-}even}$, but alternative exemplary embodiments are not limited thereto. Further, the second gate driver part 410 may generate the carry signal Cout and the gate signal Gout based on a previous carry signal and a next gate signal, respectively, obtained by synchronizing with a clock signal, e.g., the third clock signal CK_EVEN and/or the fourth clock signal CKB_EVEN, but alternative exemplary embodiments are not limited thereto.

As described herein, in an LCD display apparatus according to an exemplary embodiment of the present invention, distortion of a displayed image at different viewing position is substantially reduced or effectively prevented, thereby substantially improving a display quality of the LCD display apparatus. Further, a sub-pixel is precharged in the LCD display apparatus according to an exemplary embodiment, thereby reducing a charging time of the sub-pixel and improving a response time of the LCD display apparatus. In addition, a gate driver is directly disposed on a display panel, thereby improving a manufacturing efficiency of the LCD display apparatus.

The present invention should not be construed as being limited to the exemplary embodiments set forth herein. Rather, these exemplary embodiments are provided so that this disclosure will be thorough and complete and will fully convey the concept of the present invention to those skilled in the art.

For example, in an alternative exemplary embodiment of the present invention, a method of driving a display apparatus having a pixel having a first sub-pixel and a second sub-pixel includes: applying a first gate signal at a high logic state and a data signal at a first voltage level to the first sub-pixel during a first time interval of a horizontal scanning period; applying a second gate signal at a high logic state and a data signal at the first voltage level to the second sub-pixel during the first time interval of the horizontal scanning period; and applying the second gate signal at a high logic state and a data signal at a second voltage level to the second sub-pixel during a second time interval of the horizontal scanning period. The second voltage level is lower than the first voltage level, and at least one of a previous first gate signal and a previous second gate signal temporally overlap at least one of a current first gate signal and a current second gate signal, respectively. An amplitude of the first gate signal is different than an amplitude of the second gate signal.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:
1. A display apparatus comprising:
a panel part comprising:
a plurality of gate lines;
a plurality of data lines;
a plurality of pixels, each pixel of the plurality of pixels having a first sub-pixel and a second sub-pixel, the first sub-pixel being connected to a first gate line of the plurality of gate lines, the second sub-pixel being connected to a second gate line of the plurality of gate lines, pixels of the plurality of pixels being disposed in a column direction commonly connected to one data line of the plurality of data lines;

a data driver which receives image data and outputs a data signal to the plurality of data lines; and a gate driver part disposed on the panel part and which applies a plurality of gate signals to the plurality of gate lines, a gate signal of the plurality of gate signals applied to a gate line being temporally overlapped with a gate signal applied to an adjacent subsequent gate line for a predetermined time interval, wherein the first gate line is disposed between the first sub-pixel and the second sub-pixel, wherein the first sub-pixel and the second sub-pixel receive the data signal having a high gray-scale voltage level during a first time interval of a horizontal scanning period, and the second sub-pixel receives the data signal having a first low gray-scale voltage level less than the high gray-scale voltage level during a second time interval of the horizontal scanning period, wherein the first sub-pixel of a current pixel is precharged with the data signal having a second low gray-scale voltage level while the second sub-pixel of an adjacent previous pixel is charged with the data signal having the second low gray-scale voltage level, wherein the data signal having the second low gray-scale voltage level applied to the second sub-pixel of an adjacent previous pixel and the data signal having the high gray-scale voltage applied to the first sub-pixel of the current pixel have different polarities from each other with reference to a common voltage.

2. The display apparatus of claim 1, wherein the gate driver part comprises a plurality of stages, each stage of the plurality of stages being connected to a corresponding gate line of the plurality of gate lines, the plurality of stages are divided into a first gate driver which applies a first gate signal to the first sub-pixel and a second gate driver which applies a second gate signal to the second sub-pixel, and the plurality of stages arranges a side of the panel.

3. The display apparatus of claim 2, wherein the first gate driver and the second gate driver output the first gate signal and the second gate signal, respectively, at a logic high state during a first time interval of a horizontal scanning period to drive the first sub-pixel and the second sub-pixel, respectively, and the second gate driver outputs the second gate signal at the logic high state during a second time interval of the horizontal scanning period to drive the second sub-pixel.

4. The display apparatus of claim 3, wherein the data driver outputs the data signal having the high gray-scale voltage level to the first sub-pixel and the second sub-pixel during the first time interval of the horizontal scanning period, and outputs the data signal having the first low gray-scale voltage level lower than the first voltage level to the second sub-pixel during the second time interval of the horizontal scanning period.

5. The display apparatus of claim 4, wherein a polarity of the data signal is inverted for each consecutive frame and each consecutive row.

6. The display apparatus of claim 2, wherein the first sub-pixel is connected to odd-numbered gate lines of the plurality of gate lines, and the second sub-pixel is connected to even-numbered gate lines of the plurality of gate lines.

7. The display apparatus of claim 6, wherein the first gate driver comprises odd-numbered stages connected to corresponding odd-numbered gate lines of the plurality of gate lines, and the second gate driver comprises even-numbered stages connected to corresponding even-numbered gate lines of the plurality of gate lines.

8. The display apparatus of claim 7, wherein the odd-numbered stages receive a first clock signal and a second clock signal, the even-numbered stages receive a third clock signal and a fourth clock signal, and a first odd stage of the odd-numbered stages and a first even stage of the even-numbered stages receives a scanning start signal.

9. The display apparatus of claim 8, wherein a phase difference between the first clock signal and the second clock signal is about 180 degrees, and a phase difference between the third clock signal and the fourth clock signal is about 180 degrees.

10. The display apparatus of claim 9, wherein a phase difference between the first clock signal and the third clock signal is about 90 degrees, and a phase difference between the second clock signal and the fourth clock signal is about 90 degrees.

11. The display apparatus of claim 10, wherein periods of the first clock signal, the second clock signal, the third clock signal and the fourth clock signal are substantially equal.

12. The display apparatus of claim 11, wherein the gate signal applied to the gate line and the previous gate signal applied to an adjacent subsequent gate line temporally overlap each other for one fourth of one period of the periods of the first clock signal, the second clock signal, the third clock signal and the fourth clock signal.

13. The display apparatus of claim 8, wherein an amplitude of the first gate signal output from the first gate driver is different than an amplitude of the second gate signal output from the second gate driver.

14. The display apparatus of claim 13, wherein amplitudes of the first clock signal and the second clock signal are different than amplitudes of the third clock signal and the fourth clock signal.

15. The display apparatus of claim 1, further comprising:

a timing controller which receives the image data from the outside and outputs the image data to the data driver; and a gray-scale voltage generator which provides a gray-scale voltage to the data driver to generate the data signal output to the plurality of data lines.

16. A method of driving a display apparatus having a pixel comprising a first sub-pixel and a second sub-pixel, the method comprising:

applying a first gate signal at a high logic state to a first gate line and a data signal to the first sub-pixel; and applying a second gate signal at the high logic state to a second gate line and a data signal to the second sub-pixel, wherein the first gate signal temporally overlaps the second gate signal, wherein the first sub-pixel and the second sub-pixel receive the data signal having a high gray-scale voltage level during a first time interval of a horizontal scanning period, and the second sub-pixel receives the data signal having a first low gray-scale voltage level less than the high gray-scale voltage level during a second time interval of the horizontal scanning period, wherein the first sub-pixel of a current pixel is precharged with the data signal having a second low gray-scale voltage level while the second sub-pixel of an adjacent previous pixel is charged with the data signal having the second low gray-scale voltage level, wherein the data signal having the second low gray-scale voltage level applied to the second sub-pixel of an adjacent previous pixel and the data signal having the high gray-scale voltage applied to the first sub-pixel of the current pixel have different polarities from each other with reference to a common voltage.

17. The method of claim 16, wherein an amplitude of the first gate signal is different than an amplitude of the second gate signal.

18. The method of claim 16, wherein the first gate line is disposed between the first sub-pixel and the second sub-pixel.

* * * * *